United States Patent
Hsu et al.

[19]

[11] Patent Number: 5,923,593

[45] Date of Patent: Jul. 13, 1999

[54] MULTI-PORT DRAM CELL AND MEMORY SYSTEM USING SAME

[75] Inventors: Fu-Chieh Hsu, Saratoga; Wingyu Leung, Cupertino, both of Calif.

[73] Assignee: Monolithic Systems, Inc., Sunnyvale, Calif.

[21] Appl. No.: 08/767,707

[22] Filed: Dec. 17, 1996

[51] Int. Cl.$^6$ ................................ G11C 7/00; G11C 8/00
[52] U.S. Cl. ................ 365/189.04; 365/149; 365/230.05
[58] Field of Search ............................ 365/189.04, 149, 365/210, 230.05, 189.01

[56] References Cited

U.S. PATENT DOCUMENTS

| | | | |
|---|---|---|---|
| 5,007,022 | 4/1991 | Leigh | 365/189.04 |
| 5,355,335 | 10/1994 | Katsuno | 365/189.04 |
| 5,646,903 | 7/1997 | Johnson | 365/230.05 |
| 5,768,178 | 6/1998 | McLaury | 365/149 |

*Primary Examiner*—Son Mai
*Attorney, Agent, or Firm*—Skjerven, Morrill MacPherson, Franklin & Friel LLP; Norman R. Klivans

[57] ABSTRACT

A multi-port DRAM cell structure that enables read, write and refresh accesses at each port of the DRAM cell. The DRAM cell includes a storage capacitor for storing a data value, and a plurality of ports for accessing the storage capacitor. Each port enables both read and write accesses to the storage capacitor. Each port can include a port access transistor, a port bitline and a port wordline. The port access transistor includes a gate electrode, a source and a drain. The source of the port access transistor is coupled to the storage capacitor, the drain of the port access transistor is coupled to the port bitline, and the gate electrode of the port access transistor is coupled to the port wordline. This cell architecture enables overlapping read and write accesses to be simultaneously performed at the various ports of the multi-port DRAM cell.

15 Claims, 7 Drawing Sheets

MULTI-PORT DRAM CELL AND MEMORY SYSTEM USING SAME

BACKGROUND OF THE INVENTION

1. Field of the Invention

The present invention relates to a dynamic random-access memory (DRAM). More specifically, the present invention relates to a multi-port DRAM cell structure, as well as a circuit and method for accessing a multi-port DRAM cell.

2. Description of the Prior Art

Conventional DRAM cells have been provided in both single port and dual port configurations. In a typical single port configuration, as shown in FIG. 1, a DRAM cell 100 consists of an access transistor 101, a storage capacitor 120, a bitline 111 and a wordline 106. During a write access, a wordline enable signal is asserted on wordline 106 thereby turning on transistor 101. A data signal is provided on bitline 111. This signal is routed through transistor 101 and stored in capacitor 120. During a read access, a wordline enable signal is asserted on wordline 106 to turn on transistor 101. The data signal stored in capacitor 120 is routed to bitline 111 through transistor 101. This data signal is amplified by a sense amplifier (not shown) and then provided to the device initiating the read access. A disadvantage of a single port cell is that it does not enable dual port access.

FIG. 2 is a schematic diagram of a conventional dual-port DRAM cell 200. Cell 200 consists of write access transistor 201, read access transistor 202 and storage capacitor 220. The operation of cell 200 is similar to that of single port DRAM cell 100, except the read and write accesses are performed at two separate dedicated ports. The write port is defined by the write bitline 211 and write wordline 206. The read port is defined by the read bitline 212 and read wordline 205.

During a write access, a write wordline enable signal is asserted on write wordline 206, thereby turning on write transistor 201. A data signal is provided to capacitor 220 through write bitline 211 and write transistor 201. During a read access, a logic high wordline enable signal is asserted on read wordline 205. If a logic high data value is stored in capacitor 220, read transistor 202 turns on and the logic high wordline enable signal on read wordline 205 is transmitted to read bitline 212. If a logic low data value is stored in the capacitor 220, transistor 202 is not turned on, and read bitline 212 is left floating (i.e. a logic low value).

Another conventional dual-port DRAM cell 300, illustrated in FIG. 3, has a structure similar to dual-port DRAM cell 200 (FIG. 2). Thus, similar elements in DRAM cells 200 and 300 are labeled with similar reference numbers. However, the read access transistor 202 of DRAM cell 200 is replaced with read access transistors 302 and 303 in DRAM cell 300. The write access for DRAM cell 300 is identical to the write access of DRAM cell 200 (FIG. 2). The read access of DRAM cell 300 is carried out as follows.

A logic high wordline enable signal is asserted on read wordline 306, thereby turning on read access transistor 303 to couple read access transistor 302 to read bitline 312. If a logic high data value is stored in capacitor 320, then read access transistor 302 turns on, thereby drawing current from read bitline 312 indicating one data polarity. Conversely, if a logic low data signal is stored in capacitor 320, then read access transistor 302 is turned off, and no current will be drawn from read bitline 312 indicating a different data polarity.

The conventional dual-port DRAM cells 200 and 300 have several limitations. One limitation is that overlapping access is not allowed on a conventional dual-port DRAM cell. Overlapping access is defined as the ability to initiate either a read access or a write access at either port of the dual-port DRAM cell at any time. For example, a dual-port DRAM cell which provides for overlapping access would allow a first read access to be performed on a first port of the cell, while a second read access is performed on a second port of the cell. Because the two ports of dual-port DRAM cells 200 and 300 are dedicated read or write ports, overlapping access as described above is not permitted by dual-port DRAM cells 200 and 300.

Another limitation is that a refresh access can only be performed at one port of DRAM cells 200 and 300 (i.e., the write port). The charge stored in the storage capacitors of cells 200 and 300 can be depleted by leakage through the read and/or write access transistors. To compensate for this charge depletion, the storage capacitors must be periodically refreshed. A refresh access is performed by performing a read access followed by a write access, such that the data signal read from the cell is written back into the memory cell. In conventional dual-port DRAM cells 200 and 300, a write access can only be performed at the write port while a read access can only be performed at the read port. Thus, the refresh access must be performed using both the write port and the read port.

Another disadvantage of the conventional dual port cells is the large size on a die that a cell occupies. Conventional dual-port cells require a drain-to-gate connection. For example, in FIG. 2, a drain-to-gate connection between the drain of transistor 201 and the gate of transistor 202 is necessary. Similarly, in FIG. 3, there exists a drain-to-gate connection between the drain of transistor 301 and the gate of transistor 302. In conventional semiconductor technology, a via and a polysilicon or metal trace is typically required in order to make a drain-to-gate connection. Because the via and trace consume real estate on the die, the layout density of the resulting dual-port cell is reduced.

It would therefore be desirable to provide for a multi-port DRAM cell that overcomes these limitations of the prior art. One of the objectives of the present invention is to provide a multi-port DRAM cell which enables overlapping access. A further objective is to provide for a multi-port DRAM cell where write, read and refresh accesses can be performed on more than one port. Another objective is to provide a multi-port DRAM cell with reduced size by eliminating the transistor drain-to-gate connection. It is yet another objective of this invention to provide for a multi-port DRAM cell that provides a data access rate which is faster than the access rate of a conventional DRAM cell.

SUMMARY

In accordance with the present invention, a multi-port DRAM cell is provided. This multi-port DRAM cell includes at least one storage capacitor, and a plurality of access transistors coupled to the storage capacitor. An access transistor is provided for each port of the multi-port DRAM cell. For example, a dual-port DRAM cell in accordance with the invention has a first access transistor and a second access transistor. The source of each access transistor is coupled to the storage capacitor. The drain of each access transistor is coupled to a corresponding bitline, and the gate electrode of each access transistor is coupled to a corresponding wordline. Each port therefore has a dedicated access transistor, bitline and wordline for accessing the storage capacitor. This configuration enables read, write, and refresh accesses to be performed at each port. This configuration also eliminates the drain-to-gate connections required by conventional dual-port DRAM cells 200 and 300.

In one embodiment, the capacitor of the multi-port DRAM cell is fabricated over the access transistors using a capacitor-on-bitline configuration. In other embodiments, the capacitor can be implemented as a trench capacitor, a finned capacitor, trench-finned transistor, or a stacked capacitor.

Dual-port DRAM cells in accordance with the invention can be arranged to form a plurality of DRAM cell arrays. These DRAM cell arrays are connected using an open bitline architecture, thereby forming a larger DRAM memory system. In this open bitline architecture, a row of sense amplifiers is located between each pair of neighboring DRAM cell arrays. Each sense amplifier is coupled to a pair of bitlines, with one bitline being received from each of the two neighboring DRAM cell arrays. Each bitline corresponds to the same port of the neighboring DRAM cell arrays. For example, a sense amplifier can be coupled to a first bitline from a first DRAM cell array and a first bitline from a neighboring second DRAM cell array, wherein the first bitline is coupled to the first port of each cell in a column of the first DRAM cell array, and the second bitline is coupled to the first port of each cell in a column of the second DRAM cell array. In one embodiment, dummy wordlines are provided in each DRAM cell array to eliminate wordline coupling noise (which can be significant in an open bitline architecture). Dummy cell arrays or dummy loads can be coupled to the DRAM cell arrays located near the edges of the DRAM memory system to balance the loads on the sense amplifiers coupled to these DRAM cell arrays.

The present invention will be more fully understood in light of the following detailed description taken together with the drawings.

DETAILED DESCRIPTION OF THE INVENTION

Figure 4:
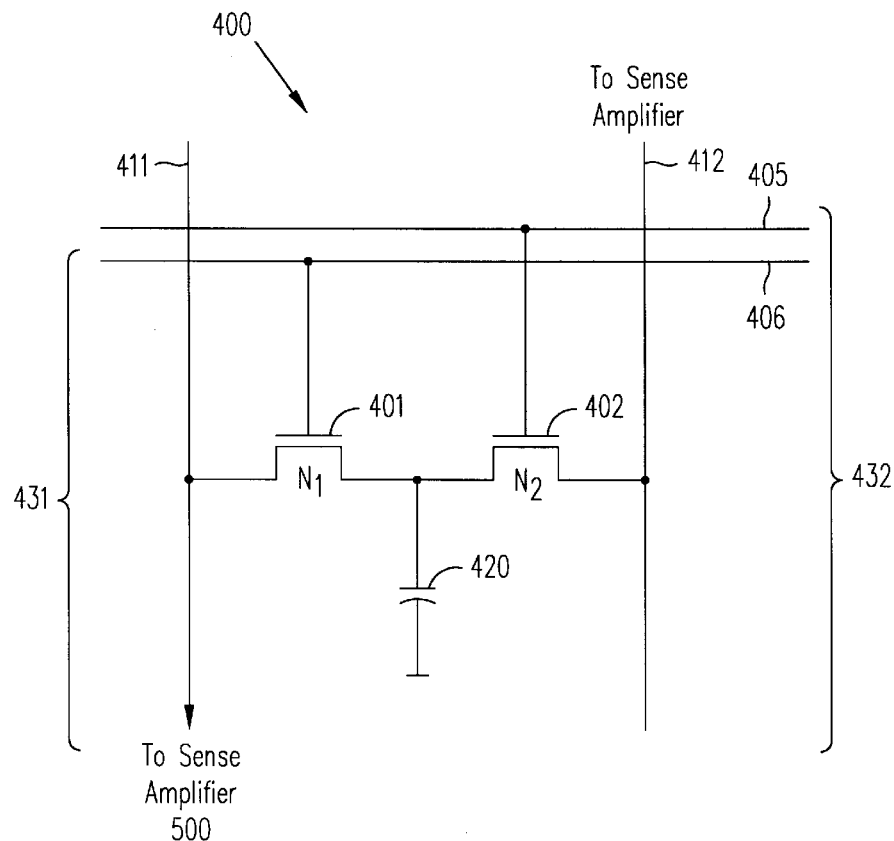
FIG. 4 is a schematic diagram of a DRAM cell according to the present invention.

FIG. 4 is a schematic view of a multi-port DRAM cell 400 in accordance with one embodiment of the present invention. Multi-port DRAM cell 400 is a dual-port cell which consists of a storage capacitor 420 and two n-channel field effect transistors 401 and 402. Although the present invention is described in connection with n-channel transistors, it is understood that p-channel transistors can be used in another embodiment of the invention. Storage capacitor 420 has a first terminal and a second terminal. The first terminal of capacitor 420 is coupled to a plate voltage supply ($V_{CCH}$) which is usually one-half of $V_{CC}$ but can be any level between $V_{CC}$ and $V_{SS}$. The second terminal of storage capacitor 420 is coupled to the sources of access transistors 401 and 402. The drain of first port access transistor 401 is coupled to a first port bitline 411, and the gate electrode of first port access transistor 401 is coupled to a first port wordline 406. Similarly, the drain of second port access transistor 402 is coupled to a second port bitline 412, and the gate electrode of second port access transistor 402 is coupled to a second port wordline 405.

First port wordline 406 and first port bitline 411 define a first port 431 of the DRAM cell 400. Similarly, second port wordline 405 and second port bitline 412 define a second port 432 of the DRAM cell 400. Read and write accesses can be performed at the first port 431 of the multi-port DRAM cell 400 as follows.

A write access to the first port 431 of cell 400 is performed by asserting a logic high wordline enable signal on the first port wordline 406, thereby turning on the first port access transistor 401. After the first port access transistor 401 has been turned on, the data signal to be written to cell 400 is asserted on the first port bitline 411. This data signal is routed through the first port access transistor 401 and stored in capacitor 420.

A read access to the first port 431 of cell 400 is performed by asserting a logic high wordline enable signal on the first port wordline 406, thereby turning on first port access transistor 401. After first port access transistor 401 has been turned on, the charge stored in capacitor 420 is transmitted to the first port bitline 411 through the first port access transistor 401. This charge is applied to a sense amplifier 500 (FIG. 5), which generates a data signal having a full supply voltage in response to the charge received.

Read and write accesses to the second port 432 of the multi-port DRAM cell 400 are performed in a manner similar to accesses to the first port 431. That is, the second port 432 is accessed by asserting a logic high wordline enable signal on the second port wordline 405, thereby turning on the second port access transistor 402.

In the foregoing manner, multi-port DRAM cell 400 enables both read and write accesses to be performed at first port 431 and second port 432. Thus, multi-port DRAM cell 400 advantageously enables overlapping accesses. These overlapping accesses are described in more detail below.

Figure 5:
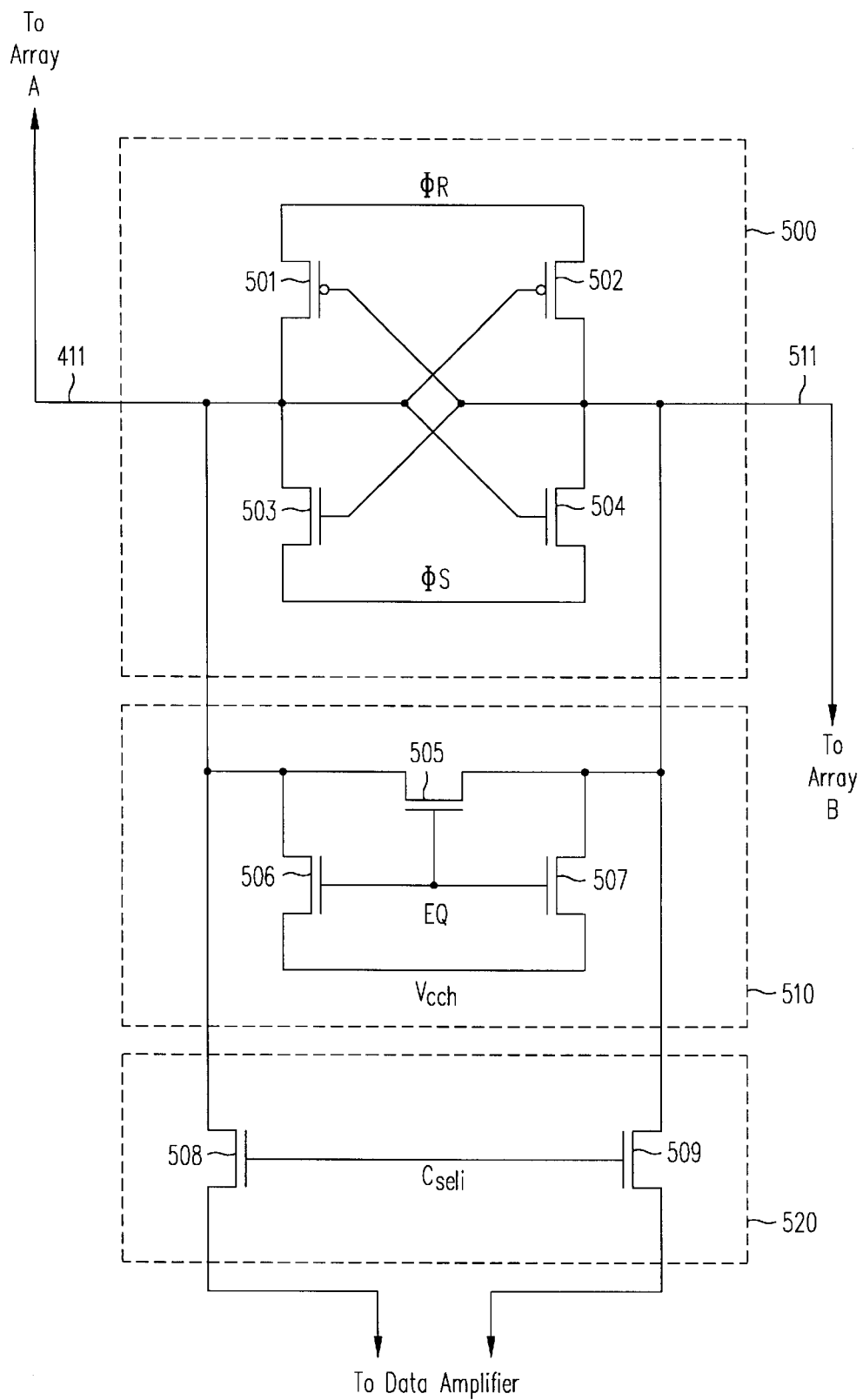
FIG. 5 is a schematic diagram of a sense amplifier used with the DRAM cells disclosed in this invention.

FIG. 5 shows a sense amplifier 500, an equalization circuit 510 and a column select circuit 520 used in one embodiment of the present invention. Sense amplifier 500 consists of p-channel transistors 501 and 502 and n-channel transistors 503 and 504, which are coupled to form a regenerative latch. The source of p-channel transistors 501 and 502 are connected to a controlled power source $\Phi_R$, the source of n-channel transistors 503 and 504 are connected to a controlled power source $\Phi_S$. When sense amplifier 500 is activated, $\Phi_R$ has a voltage of $V_{CC}$ (e.g., 3.3 Volts) and $\Phi_R$ has a voltage of $V_{SS}$ (e.g., 0 volts). When sense $\Phi_S$ amplifier 500 is not activated, $\Phi_S$ and $\Phi_R$ are left floating (i.e., disconnected form $V_{CC}$ and $V_{SS}$) Sense amplifier circuit 500 operates in response to the voltage levels present on bitlines 411 and 511. Note that bitline 411 corresponds to the first port bitline of DRAM cell 400. As described in more detail below in connection with FIG. 6, bitline 511 corresponds to a first port bitline of a DRAM cell in another DRAM cell array.

Equalization circuit 510 includes n-channel equalization transistors 505, 506, and 507, which are coupled to bitlines 411 and 511 as illustrated. Equalization circuit 510 operates in response to an equalization signal EQ which is applied to the gate electrodes of transistors 505–507.

Column select circuit 520 includes n-channel column select transistors 508 and 509, which are coupled to bitlines 411 and 511, respectively. Column select circuit 520 operates in response to a column select signal $C_{SELi}$, which is applied to the gate electrodes of transistors 508 and 509.

Before a data signal is provided on either of bitlines 411 or 511 for amplification by sense amplifier 500, the voltages on bitlines 411 and 511 are equalized to $V_{CCH}$, where $V_{CCH}$ is usually the average of the logic high voltage $V_{CC}$ and the logic low voltage $V_{SS}$. This is accomplished by applying a logic high equalization signal EQ to the gates of equalization transistors 505–507. Turning on equalization transistors 505–507 causes an extrinsic voltage source having a voltage of $V_{CCH}$ to be coupled to bitlines 411 and 511. The equalization signal EQ is de-asserted immediately before a data signal is provided on either of bitlines 411 or 511, thereby enabling sense amplifier 500 to properly amplify this data signal. In an alternative embodiment, equalization transistors 506 and 507 and the $V_{CCH}$ supply voltage are eliminated, such that equalization transistor 505 performs the bitline equalization function by shorting bitlines 411 and 511.

A data signal can be provided on either bitline 411 or 511 for amplification by sense amplifier 500. Because of the bi-stable nature of the regenerative latch formed by sense amplifier 500, a data signal on bitline 411 having a voltage less than $V_{CCH}$ causes the sense amplifier 500 to couple the logic low $V_{SS}$ voltage supply to bitline 411 (and the logic high $V_{CC}$ voltage supply to bitline 511). Conversely, a data signal having a voltage greater than $V_{CCH}$ will cause the sense amplifier 500 to couple the logic high $V_{CC}$ voltage supply to bitline 411 (and the logic low $V_{SS}$ voltage supply to bitline 511).

The amplified data values established on bitlines 411 and 511 are provided to column select transistors 508 and 509, respectively. A logic high column select signal $C_{SELi}$ is asserted to turn on column select transistors 508 and 509, thereby providing the amplified data values to a data amplifier (not shown). Variations of sense amplifier 500, equalization circuit 510 and column select circuit 520 could be implemented by one of ordinary skill in the art. Such variations are considered to be within the scope of the present invention.

Figure 6:
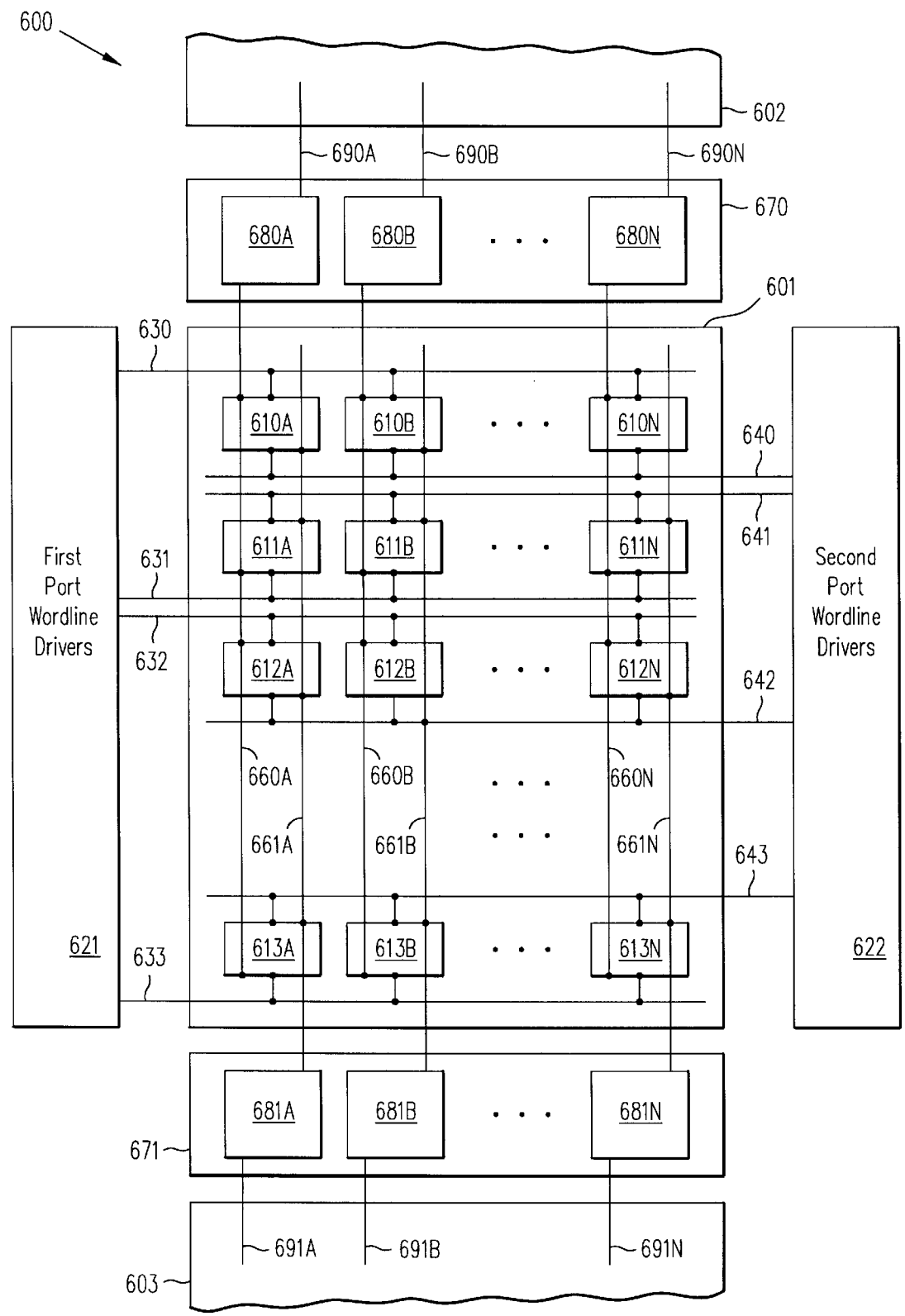
FIG. 6 is a schematic diagram of a memory system implementing dual-port DRAM cells in accordance with one embodiment of the invention.

FIG. 6 is a schematic diagram of a section of a DRAM memory system 600 which includes a plurality of multi-port DRAM cell arrays 601, 602 and 603. Each of cell arrays 601–603 includes an array of dual-port DRAM cells, each of which is identical to the previously described dual-port cell 400. For example, DRAM cell array 601 includes dual-port memory cells 610a–610n, 611a–611n, 612a–612n and 613a–613n. Each of cell arrays 601–603 is coupled to two dedicated wordline driver circuits. For example, cell array 601 is coupled to first port wordline driver circuit 621 and second port wordline driver circuit 622. First port wordline driver circuit 621 is located to the left of cell array 601, and second port wordline driver circuit 622 is located on the right of cell array 601. First port wordline driver circuit 621 is coupled to a plurality of first port wordlines 630–633. Each of the first port wordlines 630–633 is coupled to a first port access transistor (which corresponds to transistor 401 in FIG. 4) in a corresponding row of cells. For example, wordline 630 is coupled to the first port access transistor in each of memory cells 610a–610n. Similarly, the second port wordline driver circuit 622 is coupled to a plurality of second port wordlines 640–643. Each of the second port wordlines 640–643 is coupled to a second port access transistor (which corresponds to transistor 402 in FIG. 4) in a corresponding row of cells. For example, second port wordline 640 is coupled to the second port access transistor in each of memory cells 610a–610n.

A plurality of first port bitlines 660a–660n and second port bitlines 661a–661n are coupled to the columns of DRAM cells. More specifically, a first port bitline is coupled to the first port of each DRAM cell in cell array 601. Similarly, a second port bitline is coupled to the second port of each DRAM cell in cell array 601. For example, first port bitline 660a is coupled to the first port of each of cells 610a–613a, and second port bitline 661a is coupled to the second port of each of cells 610a–613a.

Each of the first port bitlines 660a–660n is coupled to a corresponding one of sense amplifiers 680a–680n in first port sense amplifier circuit 670. For example, first port bitline 660a is coupled to sense amplifier 680a. Similarly, each of the second port bitlines 661a–661n is coupled to a corresponding one of sense amplifier 681a–681n in second port sense amplifier circuit 671. For example, second port bitline 661a is coupled to sense amplifier 681a. In the described embodiment, each of the sense amplifiers 680a–680n and 681a–681n is identical to the previously described sense amplifier 500 (FIG. 5).

DRAM cell arrays 602 and 603 are substantially identical to DRAM cell array 601. Each of the sense amplifiers 680a–680n in first port sense amplifier circuit 670 is coupled to receive a corresponding one of the first port bitlines 690a–690n from cell array 602. Similarly, each of the sense amplifiers 681a–681n in second port sense amplifier circuit 671 is coupled to receive a corresponding one of the second port bitlines 691a–691n from cell array 603. This architecture is referred to as an open bitline architecture.

The memory cells in the cell arrays 601–603 can be accessed in an overlapping manner (overlapping access). For example, the first port wordline driver 621 can assert a wordline enable signal on first port wordline 630 to cause data values to be read from the first ports of cells 610a–610n to first port sense amplifier circuit 670 on first port bitlines 660a–660n. Immediately after first port sense amplifier circuit 670 has amplified these data values, the second port wordline driver 622 can assert a wordline enable signal on second port wordline 640 to cause these data values to be read from the second ports of cells 610a–610n to second part sense amplifier circuit 680 on second port bitlines 661a–661n. This slight staggering of the read accesses is required because the storage capacitors present in the DRAM cells are typically not large enough to store a charge sufficient to drive two separate sense amplifiers. Although the two read accesses are staggered, these read access can be carried out during the same clock cycle. Thus, simultaneous read operations can be performed at the first port and the second port of the DRAM cells located in the same row of the cell array (i.e., cells 610a–610n).

In a similar manner, simultaneous write operations can be performed at the first port and the second port of the DRAM cells located in the same row of the cell array (i.e., cells 610a–610n). However, such a simultaneous write operation would result in an indeterminate data value being written to these DRAM cells.

Alternatively, while data values are being read from the first port of memory cells 610a–610n, the second port wordline driver 622 can assert a wordline enable signal on second port wordline 641 to cause data values to be read from the second ports of memory cells 611a–611n to second port sense amplifier circuit 671 on second port bitlines 661a–661n. Thus, simultaneous read operations can be performed at different ports of memory cells in different rows of the same cell array.

Similarly, overlapping read and write accesses are possible. For example, the first port wordline driver circuit 621 can assert a wordline enable signal on first port wordline 631, and data values can be provided from first port sense amplifier circuit 670 to the first ports of memory cells 611a–611n on first port bitlines 660a–660n, thereby causing data values to be written into memory cells 611a–611n. At the same time, the second port wordline driver circuit 622 can assert a wordline enable signal on the second port wordline 640, thereby causing data values to be read from the second ports of cells 610a–610n to second port sense amplifier circuit 671 on second port bitlines 661a–661n.

Moreover, immediately after the data values have been written to the first ports of memory cells 611a–611n, the second port wordline driver circuit 622 can assert a wordline enable signal on second port wordline 641, thereby causing these data values to be read out of the second ports of memory cells 611a–611n.

In the foregoing manner, dual-port DRAM cells in accordance with the present invention facilitate overlapping accesses. That is, both read and write accesses can be performed at either port of the dual-port DRAM cells of the cell arrays 601–603.

As previously discussed, DRAM cells are refreshed by performing a read access followed by a write access (i.e., a read/write-back access). Thus, in a traditional dual-port DRAM cell, both the read port and the write port must be accessed to accomplish a refresh operation. In a DRAM cell according to the present invention, however, because both read and write access can be performed at either port, refresh operations can be performed at either port of these dual-port DRAM cells. This provides additional flexibility in operating the memory system 600.

A conventional DRAM cell has a slower access speed than a conventional SRAM cell. However, the previously described overlapping access capability enables memory system 600 to be operated at an access speed which matches or exceeds the access speed of a conventional SRAM cell array. This capability is illustrated by the following example.

Suppose a sequence of four read accesses numbered from 1 to 4 are to be sequentially carried out within cell array 601. Further suppose that read accesses 1–4 must access cells in the four rows defined by cells 610a–610n, 611a–611n, 612a–612n and 613a–613n. In one embodiment of the invention, the read accesses 1–4 could be carried out as follows. Initially, read access 1 could be initiated at the first port of cells 610a–610n in the manner previously described. At the same time, read access 2 could be initiated at the second port of cells 611a–611n. After read access 1 is completed, read access 3 can be initiated at the first port of cells 612a–612n. Similarly, after read access 2 is completed, read access 4 can be initiated at the second port of cells 613a–613n. Because read accesses 1 and 2 and read accesses 3 and 4 are performed in parallel, the average access time associated with memory system 600 is approximately twice as fast as a conventional single port DRAM cell. Consecutive write accesses and consecutive read and write accesses can be implemented in a similar manner.

One problem facing a designer of memory cell arrays is the wordline coupling noise. When the voltage on a wordline drops from $V_{CC}$ to $V_{SS}$ or jumps from $V_{SS}$ to $V_{CC}$, the sudden change in voltage in a wordline creates a capacitive effect on the bitlines. Thus asserting or de-asserting a logic high wordline enable voltage may cause a small voltage ripple in the bitlines. The noise caused by this capacitive effect is called wordline coupling noise.

Wordline coupling noise can become significant in an open bitline architecture, because each sense amplifier is connected to two different arrays that may not be accessed at the same time. In FIG. 6, for example, when the first ports of cells in cell array 601 are being accessed, the cell array 602 may not be accessed. Thus, for first port sense amplifier circuit 670, a voltage ripple may exist on first port bitlines 660a–660n of cell array 601, while no voltage ripple exists on first port bitlines 690a–690n of cell array 602. The voltage ripple existing on first port bitlines 660a–660n can be effectively canceled by introducing a similar voltage ripple on bitlines 690a–690n. To accomplish this, a dummy wordline (which is not coupled to any DRAM cells, but passes over the bitlines) is included in cell array 602. In the current example, when a first port wordline 630–633 in cell array 601 is activated, the dummy wordline in cell array 602 is also activated. This creates a voltage ripple on first port bitlines 690a–690n of cell array 602 which is similar to the voltage ripple on the first port bitlines 660a–660n of cell array 601, effectively canceling the noise in the sense amplifiers 680a–680n of first port sense amplifier circuit 670.

Bitlines 660a–660b and 661a–661b of cell array 601, bitlines 690a–690n of cell array 602 and bitlines 691a–691n of cell array 603 have equal length and therefore equal capacitance. This balanced capacitance facilitates the equalization of the bitlines to $V_{CCH}$. However, at the edges of the memory system 600, each of the end cell arrays is coupled to a sense amplifier circuit which is only coupled to one set of bitlines. To balance the capacitive loading on these edge sense amplifier circuits, these sense amplifier circuits can be coupled to dummy loads and/or dummy arrays to balance the capacitive loading on these sense amplifier circuits.

Figure 7:
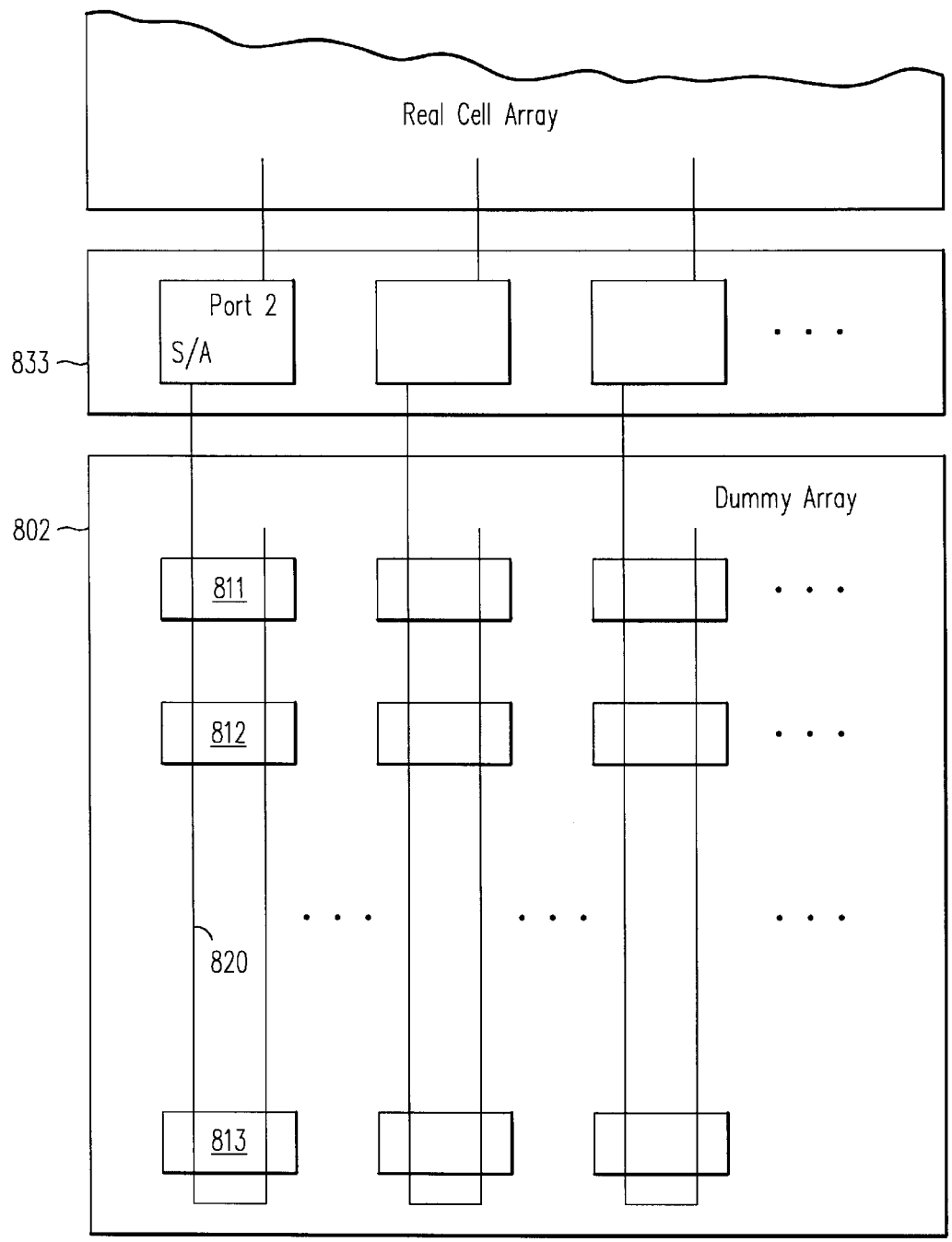
FIG. 7 is a schematic diagram of a dummy array used for load balancing.

FIG. 7 is a schematic diagram illustrating a dummy array 802 coupled to an edge sense amplifier circuit 833. Although a dummy array can be as large as one of the regular cell arrays 601, 602 or 603, in FIG. 7, the dummy array 803 is only half the size of these regular cell arrays. Thus, the number of rows in dummy array 802 is equal to half the number of rows in a regular cell array. However, the bitlines in the dummy array 802 are folded such that each bitline is connected to the same number of cells in dummy array 802 as in a regular cell array. For example, dummy bitline 820 is connected to both the first and second ports of cells 811, 812, and 813, in the first column of dummy array 802. Each sense amplifier of edge sense amplifier circuit 833 is thus connected to two bitlines with approximately equal capacitance, thereby balancing the capacitive load on edge sense amplifier circuit 833.

Figure 8:
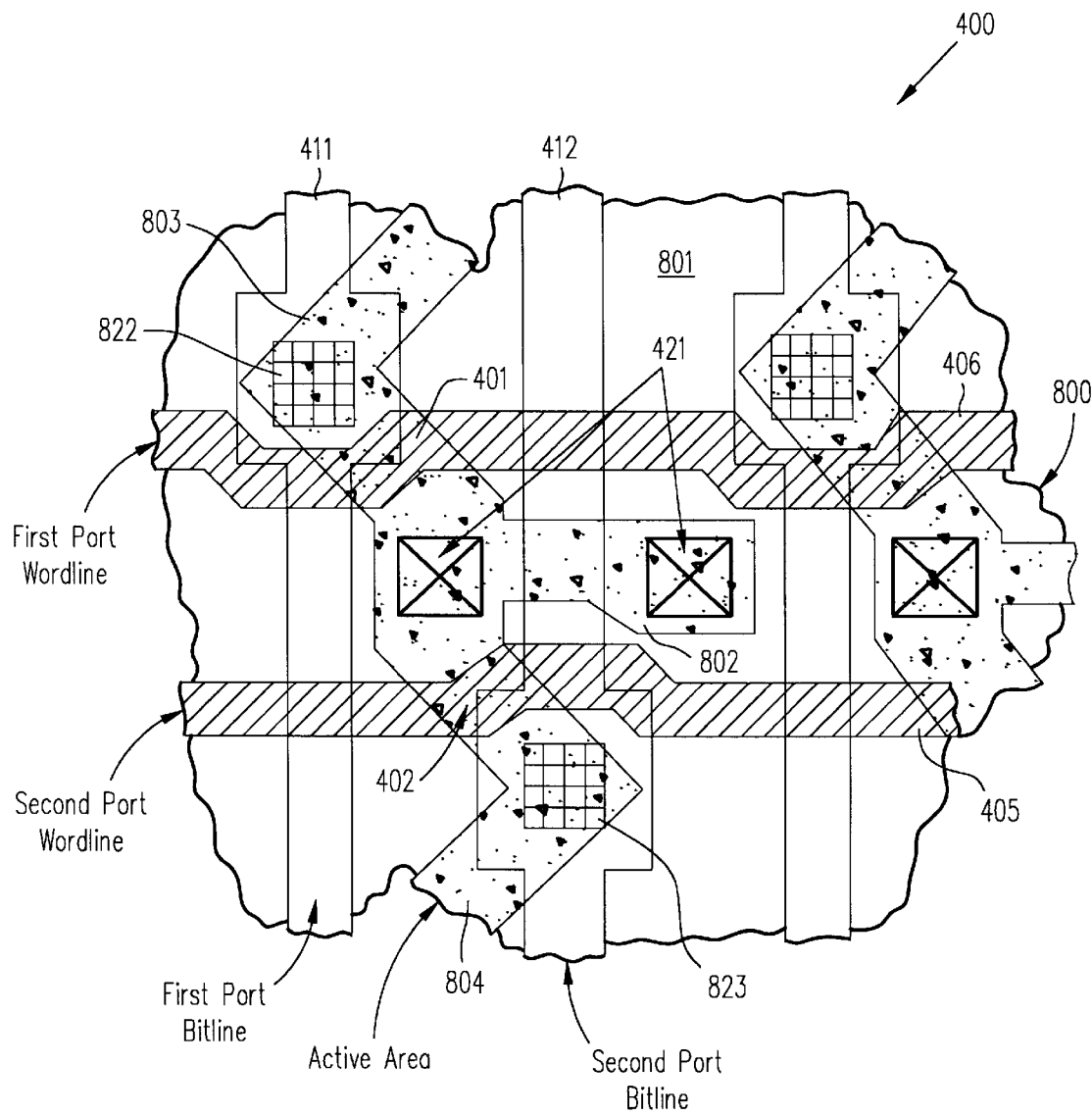
FIG. 8 is a layout diagram of a dual-port DRAM cell according to one embodiment of the present invention.

FIG. 8 is a schematic view of the layout of dual-port DRAM cell 400 in accordance with one embodiment of the present invention. In this embodiment, cell 400 is fabricated on a p-type semiconductor region 801 of a semiconductor substrate 800. Substrate 800 is typically monocrystalline silicon. The first port wordline 406 and the second port wordline 405 are formed in a polysilicon layer which extends over substrate 800. The wordline polysilicon may be further strapped with a metal layer to reduce its resistance. The first port bitline 411 and the second port bitline 412 are formed in a separate polysilicon, silicide or metal layer which extends over substrate 800. N-type source region 802 and n-type drain regions 803 and 804 are formed in p-type semiconductor region 801 as illustrated. Source region 802 acts as the source for both the first and second port access transistors 401 and 402. N-type drain region 803 is the drain region for first port access transistor 401, and n-type drain region 804 is the drain region for second port access transistor 402. Vias 421 connect the source region 802 to a capacitor structure in accordance with a conventional capacitor-on-bitline (COB) architecture. This capacitor structure, (which is not shown in FIG. 8 for purposes of clarity) can include one or more capacitors. Drain regions 803 and 804 are connected to first port bitline 411 and second port bitline 412, respectively, by conductive vias 822 and 823, respectively.

Figure 1:
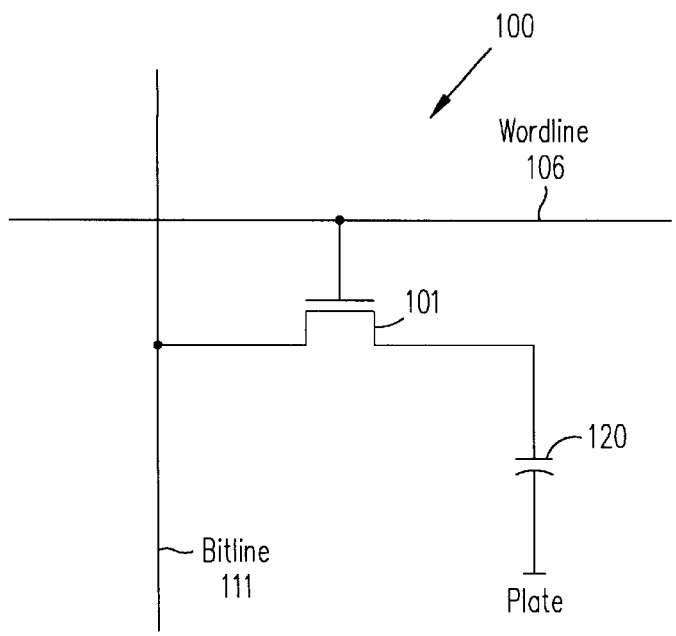
FIG. 1 is a schematic diagram of a conventional single port DRAM cell.
Figure 2:
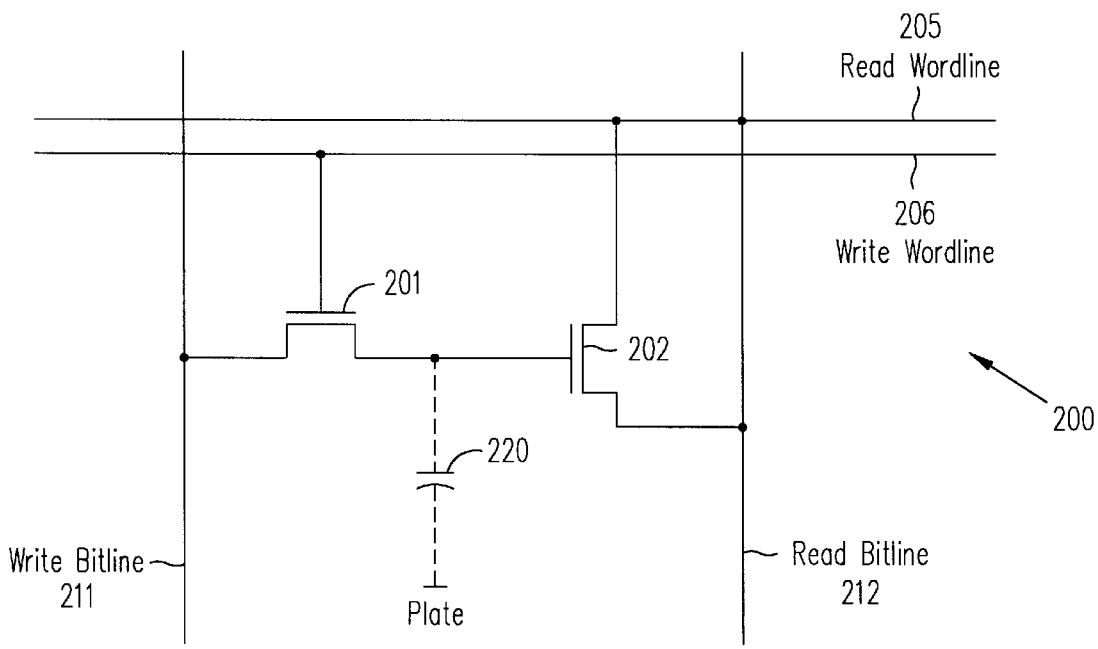
FIGS. 2 and 3 are schematic diagrams of conventional dual-port DRAM cells having dedicated read and write ports.
Figure 3:
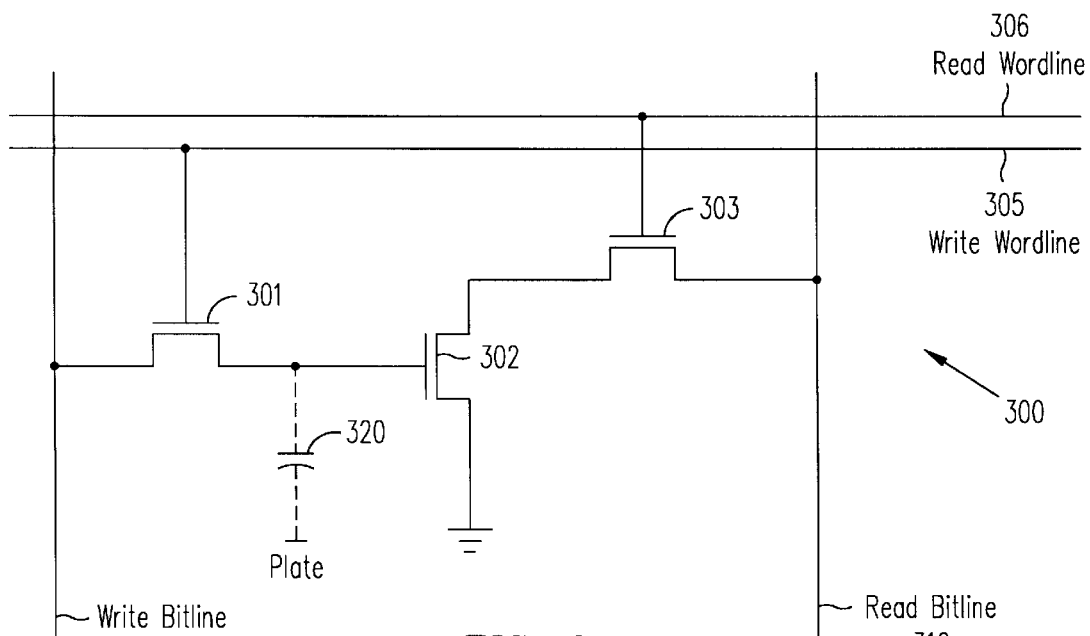

Advantageously, the layout of dual-port DRAM cell 400 described above does not require an area consuming gate-to-drain connection. As a result, the layout area of dual-port DRAM cell 400 is smaller than the layout area of either of conventional dual-port DRAM cells 200 or 300 (FIGS. 2 and 3). Although a COB architecture is illustrated in FIG. 8, other capacitor architectures, including, but not limited to trench capacitors, finned capacitors, trench-finned capacitors or stacked capacitors, can be used in DRAM cell 400.

The drain regions 803 and 804 extend beyond DRAM cell 400, thereby providing drain regions in adjacent DRAM cells in the same column as DRAM cell 400. Adjacent cells in the same column are symmetrical about their common boundary. As a result, via 822 provides a bitline contact for the first port access transistor 401 of cell 400, and for the first port access transistor in an adjacent cell (not shown). Similarly, via 823 provides a bitline contact for the second port access transistor 401 of cell 400, and for the second port access transistor in an adjacent cell (not shown). Sharing the bitline contacts among adjacent cells minimizes the number of bitline contacts required per cell, thereby further simplifying and minimizing the required layout area of cell 400.

Figure 9:
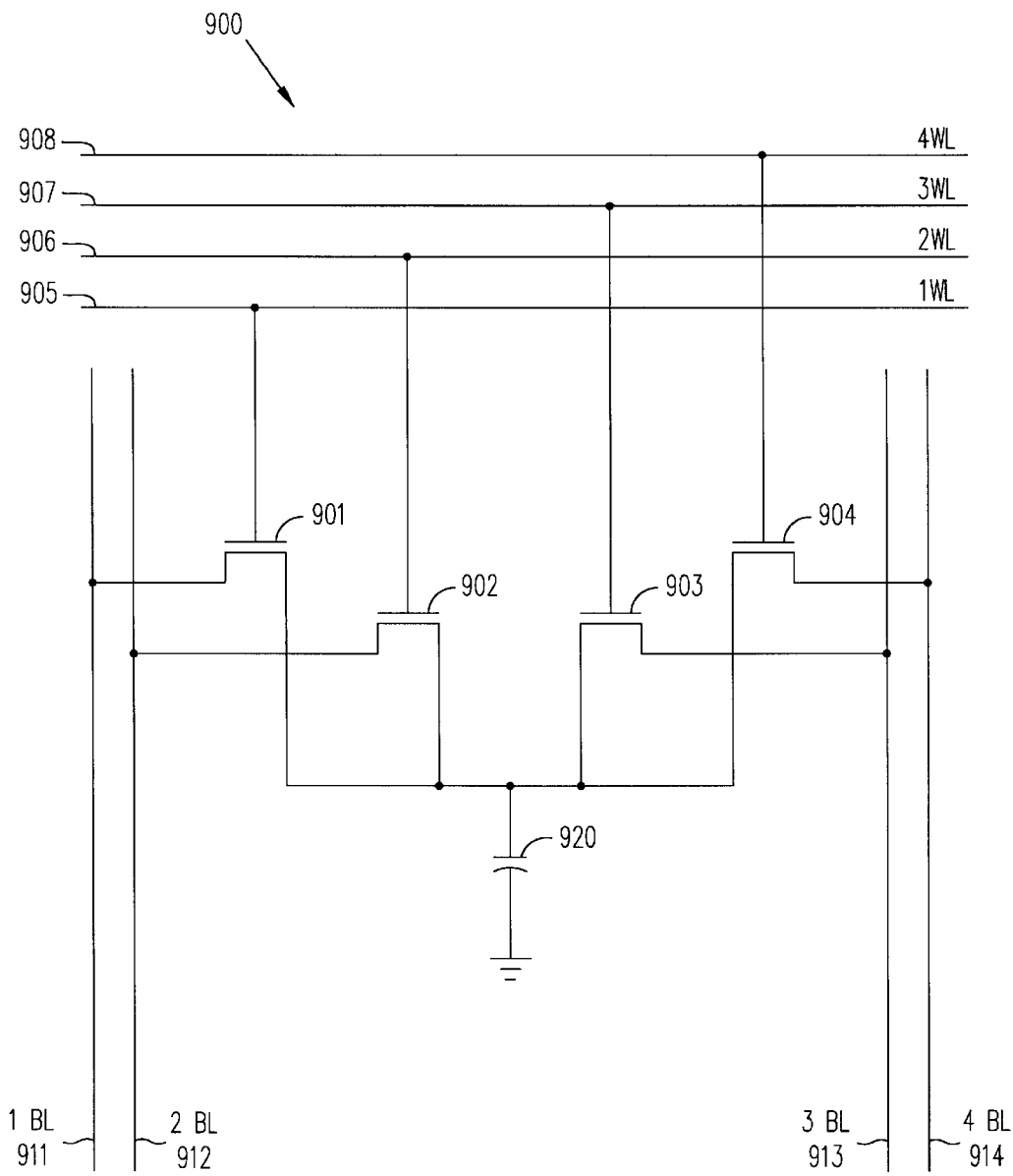
FIG. 9 is a schematic diagram of a multi-port DRAM cell which as four ports in accordance with one embodiment of the present invention.

The multi-port DRAM architecture previously described in connection with DRAM cell 400 can be extended to implement DRAM cells having other numbers of ports. For example, FIG. 9 is a schematic diagram illustrating a four-port DRAM cell 900 in accordance with one embodiment of the present invention. Four-port DRAM cell 900 includes a storage capacitor 920 which is connected to first port bitline 911, second port bitline 912, third port bitline 913 and fourth port bitline 914 through first port access transistor 901, second port access transistor 902, third port access transistor 903 and fourth port access transistor 904, respectively. First port wordline 905, second port wordline 906, third port wordline 907 and fourth port wordline 908 are coupled to the gates of first port access transistor 901, second port access transistor 902, third port access transistor 903 and fourth port access transistor 904, respectively. Four-port DRAM cell 900 is accessible in a manner similar to dual-port DRAM cell 400, but with two additional available ports. The number of ports can be as numerous as necessary for a particular application.

Although the invention is explained in context of several figures and examples, one skilled in the art would appreciate that the invention can be implemented in numerous other ways without deviating from the basic inventive concept. The scope of the invention is therefore not limited by the specific examples given.

What is claimed is:

1. A memory system comprising a plurality of dynamic random access memory (DRAM) cells arranged in a first array, wherein each of the DRAM cells has a corresponding first port and a corresponding second port, wherein each first port enables both read access and write access to the corresponding DRAM cell, and wherein each second port enables both read access and write access to the corresponding DRAM cell;

wherein each of said DRAM cells enables overlapping accesses at the first and second port of each DRAM cell.

2. The memory system of claim 1, further comprising:
a first wordline driver circuit coupled to the first port of each of the DRAM cells; and
a second wordline driver circuit coupled to the second port of each of the DRAM cells.

3. The memory system of claim 2, wherein the first wordline driver circuit and the second wordline driver circuit are located on opposite sides of the first array.

4. The memory system of claim 1, further comprising:
a first sense amplifier circuit coupled to the first port of each of the DRAM cells; and
a second sense amplifier circuit coupled to the second port of each of the DRAM cells.

5. The memory system of claim 4, wherein the first sense amplifier circuit and the second sense amplifier circuit are located at opposite sides of the first array.

6. The memory system of claim 5, wherein the overlapping accesses comprise refresh accesses.

7. The memory system of claim 1, wherein the plurality of DRAM cells are further arranged in a second array located adjacent to the first array.

8. A memory system comprising a plurality of dynamic random access memory (DRAM) cells arranged in a first array, wherein each of the DRAM cells has a corresponding first port and a corresponding second port, wherein each first port enables both read access and write access to the corresponding DRAM cell, and wherein each second port enables both read access and write access to the corresponding DRAM cell;

wherein the plurality of DRAM cells are further arranged in a second array located adjacent to the first array, and a sense amplifier circuit located between the first array and the second array, wherein the sense amplifier circuit is coupled to the first port of each of the DRAM cells in the first array, and wherein the sense amplifier circuit is coupled to the first port of each of the DRAM cells in the second array.

9. The memory system of claim 7, further comprising:
a first wordline driver circuit coupled to the first port of each of the DRAM cells in the first array;
a second wordline driver circuit coupled to the second port of each of the DRAM cells in the first array;
a third wordline driver circuit coupled to the first port of each of the DRAM cells in the second array; and
a fourth wordline driver circuit coupled to the second port of each of the DRAM cells in the second array.

10. A memory system comprising a plurality of dynamic random access memory (DRAM) cells arranged in an array, wherein:
each of the DRAM cells has a corresponding first port and a corresponding second port;
each first port enables both read access and write access to the corresponding DRAM cell;
each second port enables both read access and write access to the corresponding DRAM cell; and
the memory system enables overlapping one read or write access with another read or write access.

11. The memory system of claim 10, wherein a first read or write access at the first port of one of the DRAM cells overlaps with a second read or write access at the second port of the same DRAM cell.

12. A method of accessing a multi-port dynamic random access memory (DRAM) cell having a storage capacitor, a first port and a second port, the method comprising:

accessing the storage capacitor via the first port; and accessing the storage capacitor via the second port;

wherein the step of accessing the storage capacitor via either of the ports of the DRAM cell is a step selected from the group consisting of reading from and writing to;

wherein accessing the storage capacitor via the first port and accessing the storage capacitor via the second port overlaps.

13. A method of accessing a multi-port dynamic random access memory (DRAM) cell having a storage capacitor, a first port and a second port, the method comprising:

accessing the storage capacitor via the first port; and accessing the storage capacitor via the second port; wherein:

the step of accessing the storage capacitor via any of the ports of the DRAM cell is a step selected from the group consisting of reading from and writing to; and accessing the storage capacitor via the first port and accessing the storage capacitor via the second port overlaps.

14. The method of claim 12 further comprising:

accessing an array of the DRAM cells, the array having rows and columns of the DRAM cells, wherein each of the DRAM cells in the same row is connected to a respective common wordline and each of the DRAM cells in the same column is connected to a respective plurality of common bitlines.

15. The method of claim 14, wherein accessing a port of one of the DRAM cells overlaps with accessing a port of another of the DRAM cells.

* * * * *